(12) United States Patent
Cai

(10) Patent No.: US 11,417,712 B2
(45) Date of Patent: Aug. 16, 2022

(54) ARRAY SUBSTRATE AND DISPLAY PANEL INCLUDING CAPACITOR LAYER CONFIGURED TO DIFFUSELY REFLECT EXTERNAL LIGHT, AND METHOD OF MANUFACTURING THEREOF

(71) Applicant: Shenzhen China Star Optoelectronics Semiconductor Display Technology Co., Ltd., Guangdong (CN)

(72) Inventor: Zhenfei Cai, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 122 days.

(21) Appl. No.: 16/981,305

(22) PCT Filed: Dec. 18, 2019

(86) PCT No.: PCT/CN2019/126276
§ 371 (c)(1),
(2) Date: Sep. 16, 2020

(87) PCT Pub. No.: WO2021/097982
PCT Pub. Date: May 27, 2021

(65) Prior Publication Data
US 2021/0249475 A1    Aug. 12, 2021

(30) Foreign Application Priority Data
Nov. 22, 2019  (CN) .......................... 201911155006.5

(51) Int. Cl.
*H01L 27/32* (2006.01)
*H01L 51/52* (2006.01)
*H01L 51/56* (2006.01)

(52) U.S. Cl.
CPC ........ *H01L 27/322* (2013.01); *H01L 51/5237* (2013.01); *H01L 51/5271* (2013.01); *H01L 51/56* (2013.01); *H01L 2227/323* (2013.01)

(58) Field of Classification Search
CPC .............. H01L 27/322; H01L 51/5237; H01L 51/5268; H01L 51/5271; H01L 51/5281; H01L 51/56
USPC .......................................................... 257/40
See application file for complete search history.

(56) References Cited

U.S. PATENT DOCUMENTS

| 9,041,017 | B2 | 5/2015 | Kaplan et al. |
| 9,577,020 | B2 | 2/2017 | Kaplan et al. |
| 10,340,329 | B2 | 7/2019 | Zhai |
| 2009/0206733 | A1* | 8/2009 | Hwang ............... H01L 51/5265 445/24 |

(Continued)

FOREIGN PATENT DOCUMENTS

| CN | 102694004 | 9/2012 |
| CN | 107123666 | 9/2017 |

(Continued)

*Primary Examiner* — Matthew E. Gordon

(57) ABSTRACT

An array substrate, a display panel, and a method of manufacturing the array substrate are provided. The display panel includes the array substrate. The array substrate is provided with a light transmitting region and a capacitor region, and includes a substrate, a driving circuit layer, a second conductive layer, a passivation layer, a color filter, an anode layer, light emitting layer, and cathode layer, which are sequentially disposed from bottom to top.

8 Claims, 5 Drawing Sheets forming a semi-reflective metal layer on the dielectric insulating layer — S31 coating an organic material on the semi-reflective metal layer and forming an array pattern by photolithography, and the array pattern is a diffuse reflection layer. — S32

(56) References Cited

U.S. PATENT DOCUMENTS

| | | | |
|---|---|---|---|
| 2012/0235175 A1* | 9/2012 | Prushinskiy | H01L 27/3241 438/34 |
| 2012/0241775 A1* | 9/2012 | Kaplan | H01L 27/3276 257/E33.072 |
| 2018/0219171 A1* | 8/2018 | Kim | H01L 51/5203 |
| 2020/0091255 A1* | 3/2020 | Wang | H01L 27/3246 |
| 2020/0194727 A1* | 6/2020 | Kim | H01L 51/5275 |
| 2020/0266392 A1* | 8/2020 | Lee | H01L 27/322 |
| 2022/0019003 A1* | 1/2022 | Ahn | G02F 1/133504 |

FOREIGN PATENT DOCUMENTS

| | | | | |
|---|---|---|---|---|
| CN | 107464529 | | 12/2017 | |
| CN | 107464529 A | * | 12/2017 | G09G 3/3291 |
| CN | 109216579 A | * | 1/2019 | H01L 27/322 |
| CN | 110007532 | | 7/2019 | |
| EP | 3477723 A1 | * | 5/2019 | H01L 27/3211 |
| JP | 2004264653 A | * | 9/2004 | |
| WO | WO-2020161575 A1 | * | 8/2020 | H01L 51/5072 |

\* cited by examiner

ARRAY SUBSTRATE AND DISPLAY PANEL INCLUDING CAPACITOR LAYER CONFIGURED TO DIFFUSELY REFLECT EXTERNAL LIGHT, AND METHOD OF MANUFACTURING THEREOF

RELATED APPLICATIONS

This application is a National Phase of PCT Patent Application No. PCT/CN2019/126276 having International filing date of Dec. 18, 2019, which claims the benefit of priority of Chinese Patent Application No. 201911155006.5 filed on Nov. 22, 2019. The contents of the above applications are all incorporated by reference as if fully set forth herein in their entirety.

FIELD AND BACKGROUND OF THE INVENTION

The present invention relates to the field of display technology, and more particularly, to an array substrate, a display panel, and a method of manufacturing the array substrate.

Currently, active matrix organic light emitting diode (AMOLED) display devices are rapidly developing. Television organic light emitting diodes (TV OLEDs) mainly adopt a bottom emission structure combining a white light organic light emitting diode and a color filter. This structure is suitable for an evaporation process due to relatively low requirements. An open mask is mainly used for evaporating, in which a cathode is a reflective cathode, and light emitted by the organic light emitting diode device is reflected to a color filter to achieve colorization and reach the human eye.

Referring to FIG. 1, it is a schematic view of a conventional bottom emission organic light emitting diode device. FIG. 2 is a schematic view of a circuit structure corresponding to FIG. 1. The organic light emitting diode device 90 is provided with a light emitting region 901 and a capacitor region 902. The organic light emitting diode device 90 includes a substrate 91, a first conductive layer 92, an insulating layer 93, a second conductive layer 94, a passivation layer 95, a color filter 96, a transparent anode 97, a light emitting layer 98, and a reflective cathode 99 stacked in order from bottom to top.

The first conductive layer 92, the insulating layer 93, and the second conductive layer 94 are configured to form a capacitor in the capacitor region 902. The first conductive layer 92 and/or the second conductive layer 94 are opaque so as to form an opaque capacitor region 902. The light emitting region 901 is a light transmitting region. The light emitted by the light emitting layer 98 is reflected by the reflective cathode 99 and propagates downward through the color filter 96 to reach the human eye.

However, with continuous advancement of technology, TV products are placed in outdoor displays in many application scenarios. The outdoor displays must first overcome a problem of strong outdoor ambient light. Generally, display brightness is increased by increasing a current, but this increases power consumption and even causes serious problems such as display burnout and afterimages.

Therefore, it is urgent to provide a new array substrate, a display panel, and a method of manufacturing the array substrate to overcome the problems in the prior art.

SUMMARY OF THE INVENTION

A main object of the present invention is to provide an array substrate, a display panel, and a method of manufacturing an array substrate. By increasing the reflection area, the display brightness is increased in an outdoor strong light environment, and thus the contrast is improved, and the power consumption is reduced.

An array substrate provided with a light transmitting region and a capacitor region. The array substrate includes a substrate, a driving circuit layer, a second conductive layer, a passivation layer, a color filter, and an anode layer. Specifically, the driving circuit layer is disposed on the substrate. The driving circuit layer includes a first conductive layer and a dielectric insulating layer disposed on the first conductive layer. The second conductive layer is disposed on the driving circuit layer. The second conductive layer is configured to diffusely reflect external light from one side of the substrate. The passivation layer is disposed on the second conductive layer. The anode layer is disposed on the color filter. The first conductive layer, the dielectric insulating layer, and the second conductive layer are configured to form a capacitor in the capacitor region.

In one embodiment, the second conductive layer includes a semi-reflective metal layer and diffuse reflection layer. The semi-reflective metal layer is disposed on the dielectric insulating layer. The diffuse reflection layer is disposed on the semi-reflective metal layer.

In one embodiment, material of the semi-reflective metal layer includes Ag or MgAg alloy.

In one embodiment, the diffuse reflection layer forms an array pattern by coating an organic material and photolithography.

In one embodiment, the array pattern of the diffuse reflection layer comprises any one or more of a circle, a rectangle, a triangle or a polygon.

In one embodiment, the driving circuit layer further comprises a thin film transistor unit, and a drain electrode of the thin film transistor unit is electrically connected to the anode layer.

A method of manufacturing an array substrate includes following steps:

providing a substrate;

forming a driving circuit layer on the substrate, and the driving circuit layer includes a first conductive layer and a dielectric insulating layer disposed on the first conductive layer;

forming a second conductive layer on the driving circuit layer, and the second conductive layer is configured to diffusely reflect external light from one side of the substrate;

forming a passivation layer on the second conductive layer;

forming a color filter on the passivation layer; and forming an anode layer on the color filter. The first conductive layer, the dielectric insulating layer, and the second conductive layer are configured to form a capacitor in the capacitor region.

In one embodiment, a step of forming the second conductive layer includes:

forming a semi-reflective metal layer on the dielectric insulating layer, and material of the semi-reflective metal layer comprises Ag or MgAg alloy; and coating an organic material on the semi-reflective metal layer and forming an array pattern by photolithography, and the array pattern is a diffuse reflection layer.

A display panel including the above-mentioned array substrate is also provided.

In one embodiment, the display panel further includes a light emitting layer, a cathode layer, and a packaging layer. The light emitting layer is disposed on the anode layer. The cathode layer is disposed on the light emitting layer. The packaging layer is disposed on the cathode layer.

The beneficial effects of the present invention are described as follows. The method of manufacturing the array substrate, the display panel, and the array substrate are provided. The area of the reflection area is increased, thereby increasing the display brightness in an outdoor strong light environment, improving the contrast, and reducing the power consumption.

Figure 1:
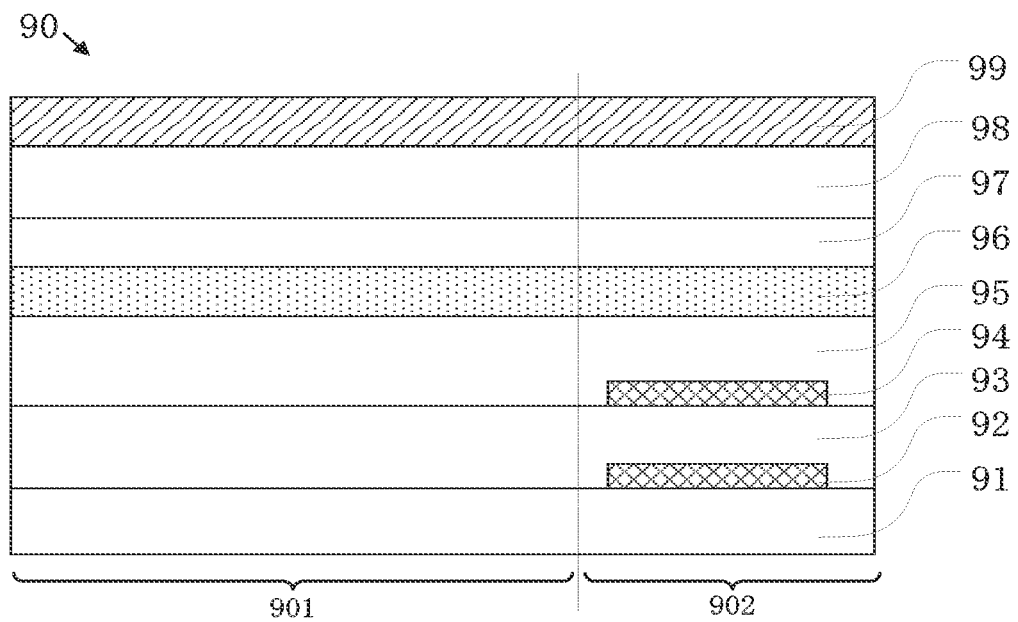
FIG. 1 is a schematic view of a conventional bottom emission organic light emitting diode device.
Figure 2:
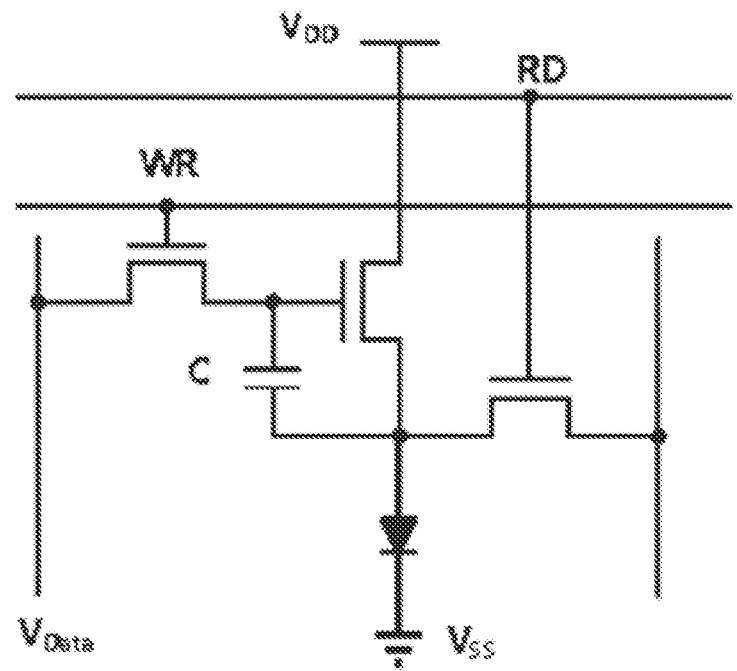
FIG. 2 is a schematic view of a circuit structure corresponding to FIG. 1.

REFERENCE NUMERALS substrate 1; driving circuit layer 2; second conductive layer 3; passivation layer 4; color filter 5; anode layer 6; light emitting layer 7; cathode layer 8; packaging layer 9; pixel defining layer 11; light transmitting region 10; capacitor region 20; first conductive layer 21; dielectric insulating layer 22; thin film transistor unit 23; thin film transistor region 30; semi-reflective metal layer 31; diffuse reflection layer 32; array substrate 100; light shielding layer 231; buffer layer 232; active layer 233; gate insulating layer 234; gate metal layer 235; source/drain metal layer 236; source electrode 2361; and drain electrode 2362.

DESCRIPTION OF SPECIFIC EMBODIMENTS OF THE INVENTION

The technical solutions in the embodiments of the present application will be clearly and completely described below with reference to the accompanying drawings in the embodiments of the present application. Obviously, the described embodiments are only a part of the embodiments of the present application, but not all the embodiments. Based on the embodiments in the present application, all other embodiments obtained by those skilled persons in the art without creative work fall into the claimed scope of the present application.

In the description of this application, it should be understood that the directional terms "center", "longitudinal", "transverse", "length", "width", "thickness", "upper", "lower", "front", "back", "left", "right", "vertical", "horizontal", "top", "bottom", "inside", "outside", "clockwise", "counterclockwise", etc. are based on the orientation or positional relationship shown in the drawings, and are only for the convenience of describing this application and simplifying the description, and do not indicate or imply that the device or element referred to must have a specific orientation, structure, and operation in a specific orientation, Therefore, they cannot be understood as a limitation on this application. In addition, the terms "first" and "second" are used for descriptive purposes only and cannot be understood as indicating or implying relative importance or implicitly indicating the number of technical features indicated. Therefore, the features defined as "first" and "second" may explicitly or implicitly include one or more of the features. In the description of the present application, the meaning of "a plurality" is two or more, unless it is specifically defined otherwise.

Figure 3:
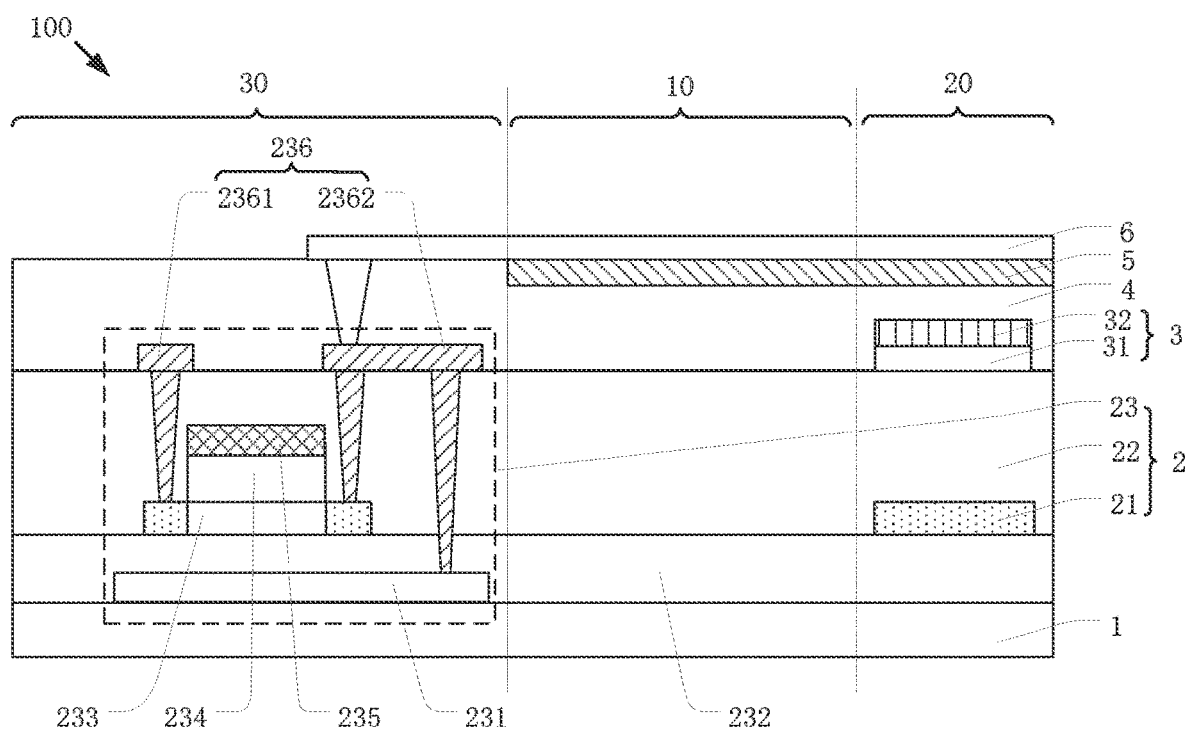
FIG. 3 is a schematic view of an array substrate according to one embodiment of the present invention.

Referring to FIG. 3. In one embodiment of the present invention, an array substrate 100 is provided. The array substrate 100 includes a light transmitting region 10 and a capacitor region 20. The array substrate 100 includes a substrate 1, a driving circuit layer 2, a second conductive layer 3, a passivation layer 4, a color filter 5, and an anode layer 6 disposed from bottom to top. Specifically, the driving circuit layer 2 is disposed on the substrate 1. The driving circuit layer 2 includes a first conductive layer 21 and a dielectric insulating layer 22 disposed on the first conductive layer 21. The second conductive layer 3 is disposed on the driving circuit layer 2, and is configured to diffusely reflect external light from one side of the substrate 1. The passivation layer 4 is disposed on the second conductive layer 3. The color filter 5 is disposed on the passivation layer 4. The anode layer 6 is disposed on the color filter 5. The first conductive layer 21, the dielectric insulating layer 22, and the second conductive layer 3 are configured to form a capacitor located in the capacitor region 20.

A light emitting layer 7 disposed above the capacitor also emits light. In this way, the second conductive layer 3 is used to diffusely reflect external light from one side of the substrate 1, which increases a reflection area. As a result, the display brightness is increased in an outdoor strong light environment. Also, the contrast is improved, the pixel aperture ratio is increased, and the current density is reduced.

Referring to FIG. 3, the second conductive layer 3 includes a semi-reflective metal layer 31 and a diffuse reflection layer 32. The semi-reflective metal layer 31 is disposed on the dielectric insulating layer. The diffuse reflection layer 32 is disposed on the semi-reflective metal layer 31.

In one embodiment, a material of the semi-reflective metal layer 31 includes Ag or MgAg alloy.

In one embodiment, the diffuse reflection layer 32 forms an array pattern by coating an organic material and photolithography.

In one embodiment, the array pattern of the diffuse reflection layer 32 includes any one or more of a circle, a rectangle, a triangle, and a polygon.

Referring to FIG. 3, in one embodiment, the array substrate 100 further includes a thin film transistor region 30. The thin film transistor region 30 is disposed adjacent to the light transmitting region 10. The driving circuit layer 2 disposed in the thin film transistor region 30 further includes a thin film transistor unit. 23. A drain electrode 2362 of the thin film transistor unit 23 is electrically connected to the anode layer 6.

More specifically, the thin film transistor unit 23 of the driving circuit layer 2 includes a light shielding layer 231, a buffer layer 232, an active layer 233, a gate insulating layer 234, a gate metal layer 235, a dielectric insulating layer 22, and source/drain metal layer 236, which are sequentially stacked from bottom to top. The source/drain metal layer 236 includes a source electrode 2361 and a drain electrode 2362, and the drain electrode 2362 is electrically connected to the light shielding layer 231 and the anode layer 6. The material of the first conductive layer 21 and the material of the active layer 233 are the same, and the material includes IGZO, IZTO, or IGZTO. The second conductive layer 3 and the source/drain metal layer 236 are disposed on the same layer.

Figure 4:
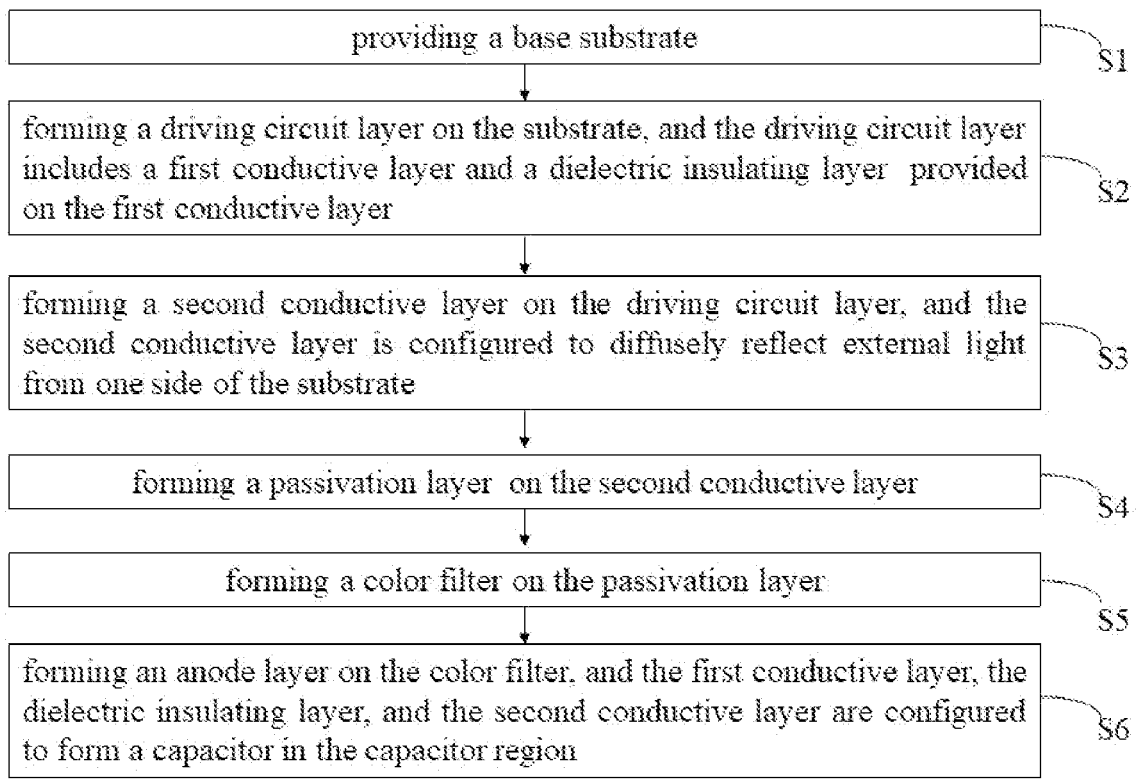
FIG. 4 is a flowchart of a method of manufacturing an array substrate according to one embodiment of the present invention.

Referring to FIG. 4, the invention also provides a method of manufacturing an array substrate 100, which includes following steps:

step S1, providing a base substrate 1;

step S2, forming a driving circuit layer 2 on the substrate 1. The driving circuit layer 2 includes a first conductive layer 21 and a dielectric insulating layer 22 disposed on the first conductive layer 21;

step S3, forming a second conductive layer 3 on the driving circuit layer 2, and the second conductive layer 3 is configured to diffusely reflect external light from one side of the substrate 1;

step S4, forming a passivation layer 4 on the second conductive layer 3;

step S5, forming a color filter 5 on the passivation layer 4; and step S6, forming an anode layer 6 on the color filter 5, and the first conductive layer 21, the dielectric insulating layer 22, and the second conductive layer 3 are configured to form a capacitor in the capacitor region 20.

Figure 5:
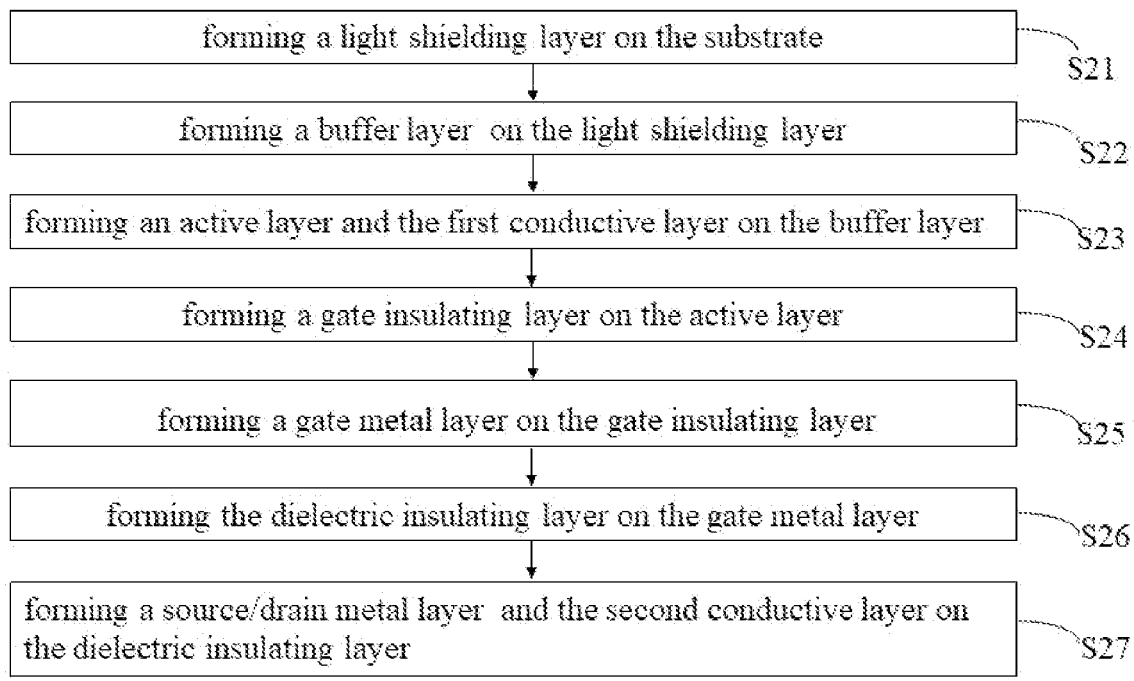
FIG. 5 is a flowchart of the steps for manufacturing a driving circuit layer described in FIG. 4.

Referring to FIG. 5, in one embodiment, the step S2 of forming the driving circuit layer 2 specifically includes:

step S21, forming a light shielding layer 231 on the substrate 1;

step S22, forming a buffer layer 232 on the light shielding layer 231;

step S23, forming an active layer 233 and the first conductive layer 21 on the buffer layer 232, wherein the material of the first conductive layer 21 and the material of the active layer 233 are the same, and the material includes IGZO, IZTO, or IGZTO;

step S24, forming a gate insulating layer 234 on the active layer 233;

step S25, forming a gate metal layer 235 on the gate insulating layer 234;

step S26, forming the dielectric insulating layer 22 on the gate metal layer 235; and step S27, forming a source/drain metal layer 236 and the second conductive layer 3 on the dielectric insulating layer 22. The source/drain metal layer 236 includes a source electrode 2361 and a drain electrode 2362. The drain electrode 2362 is electrically connected to the light shielding layer 231 and the anode layer 6. The second conductive layer 3 and the source/drain metal layer 236 are disposed on the same layer.

The light shielding layer 231, the buffer layer 232, the active layer 233, the gate insulating layer 234, the gate metal layer 23, the dielectric insulating layer 22, and the source/drain metal layer 236 are sequentially disposed from bottom to top to form a thin film transistor unit 23.

Figure 6:
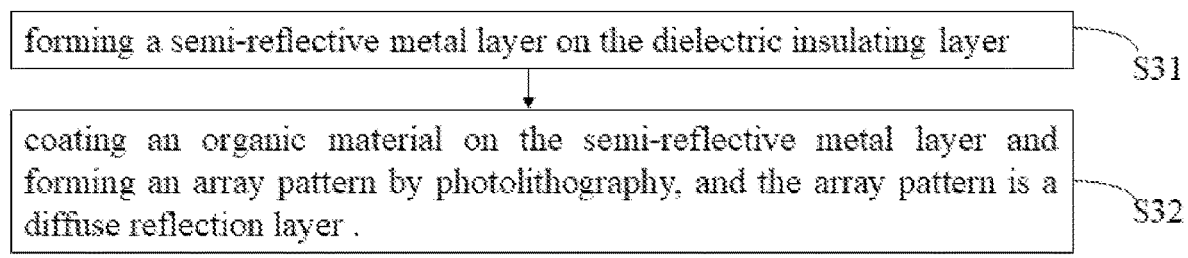
FIG. 6 is a flowchart of the steps for manufacturing the second conductive layer described in FIG. 4.

Referring to FIG. 6, in one embodiment, the step S3 of forming the second conductive layer 3 specifically includes:

step S31, forming a semi-reflective metal layer 31 on the dielectric insulating layer, wherein the material of the semi-reflective metal layer 31 includes Ag or MgAg alloy; and step S32, coating an organic material on the semi-reflective metal layer 31 and forming an array pattern by photolithography, wherein the array pattern is a diffuse reflection layer 32.

The array pattern of the diffuse reflection layer 32 is any one or more of a circle, a rectangle, a triangle, and a polygon.

Figure 7:
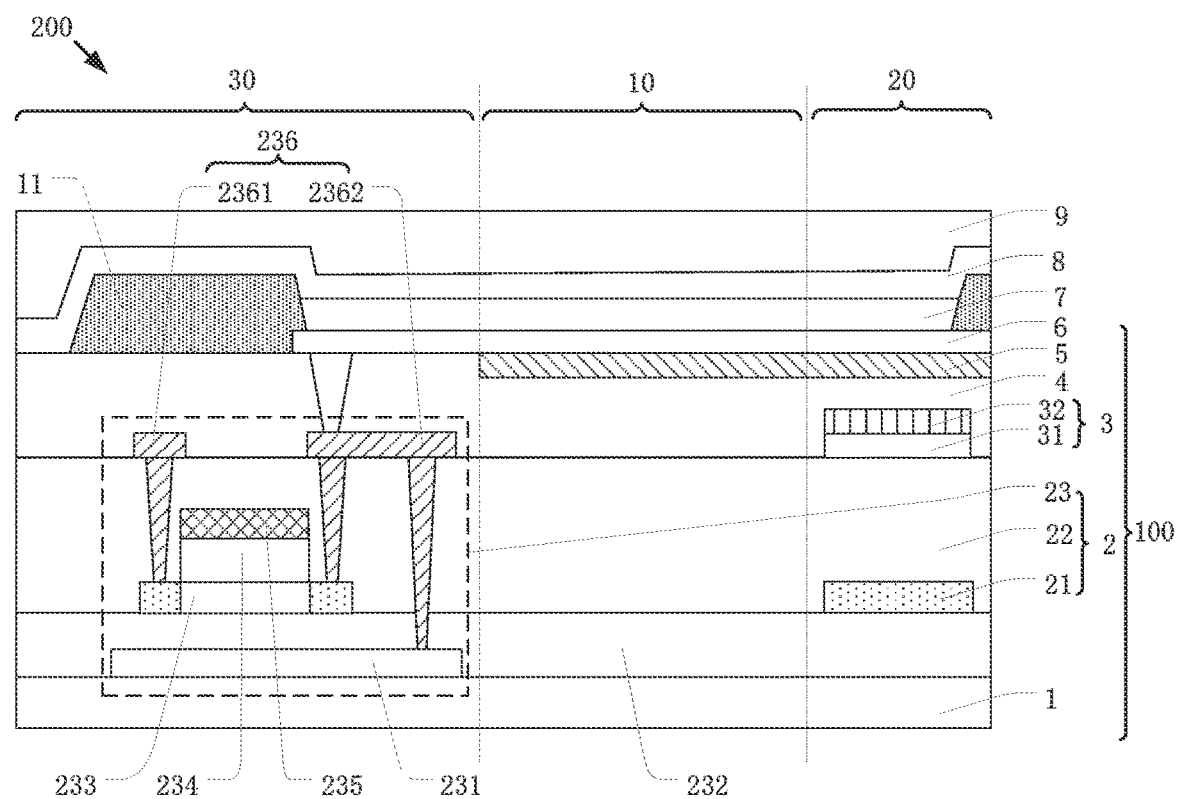
FIG. 7 is a schematic view of a display panel according to one embodiment of the present invention.

Referring to FIG. 7, a display panel 200 is also provided and includes the above-mentioned array substrate 100. The display panel 200 may be any product or component having a display function, such as a mobile phone, a tablet computer, a television, a display, a laptop, a digital photo frame, a navigator, etc.

The working principle of the display panel 200 provided in the embodiment is identical with the working principle of the foregoing embodiment of the array substrate 100. For specific structural relationship and working principle can be found in the foregoing embodiment of the array substrate 100, and details are not described herein.

Referring to FIG. 7, in one embodiment, the display panel 200 further includes a light emitting layer 7, a cathode layer 8, and a packaging layer 9. The light emitting layer 7 is disposed on the anode layer 6. The cathode layer 8 is disposed on the light emitting layer 7. The packaging layer 9 is disposed on the cathode layer 8, and the packaging layer 9 is used to block water and oxygen.

A pixel defining layer 11 is further disposed on the passivation layer 4 in the embodiment to limit the distribution of the light emitting layer, and a part of the cathode layer 8 is disposed on the pixel defining layer 11.

Figure 8:
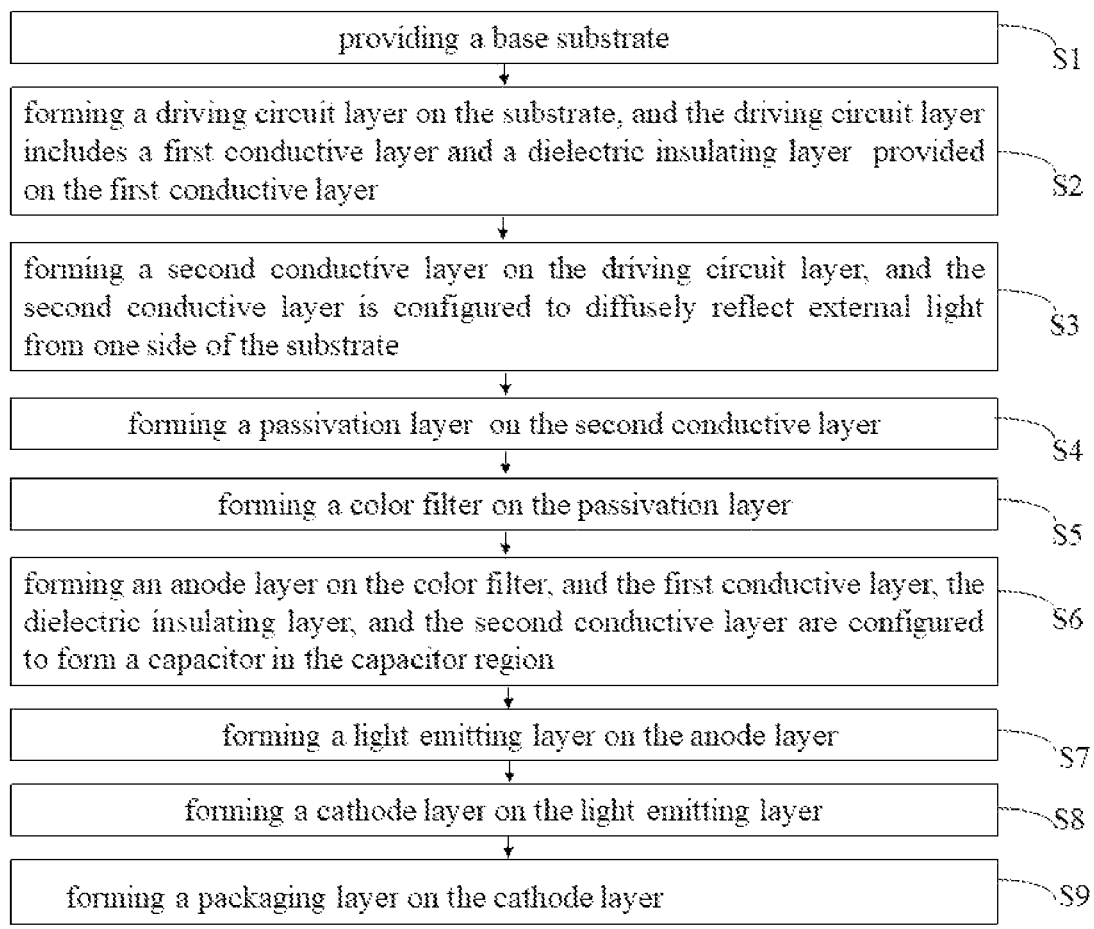
FIG. 8 is a flowchart of a method of manufacturing a display panel according to one embodiment of the present invention.

Referring to FIG. 8, in the method of manufacturing the display panel 200, the array substrate 100 is first manufactured and achieved according to the steps shown in FIG. 4, and after the step S6 of forming the anode layer 6, the steps further include:

step S7, forming a light emitting layer 7 on the anode layer 6;

step S8, forming a cathode layer 8 on the light emitting layer 7; and step S9, forming a packaging layer 9 on the cathode layer 8.

The beneficial effects of the present invention are described as follows. The method of manufacturing the array substrate 100, the display panel 200, and the array substrate 100 are provided. The area of the reflection area is increased, thereby increasing the display brightness in an outdoor strong light environment, improving the contrast, and reducing the power consumption.

In the above, the present application has been described in the above preferred embodiments, but the preferred embodiments are not intended to limit the scope of the invention, and a person skilled in the art may make various modifications without departing from the spirit and scope of the application. The scope of the present application is determined by claims.

What is claimed is:

1. An array substrate provided with a light transmitting region and a capacitor region, comprising:
   a substrate;
   a driving circuit layer disposed on the substrate, wherein the driving circuit layer comprises a first conductive layer and a dielectric insulating layer disposed on the first conductive layer;
   a second conductive layer disposed on the driving circuit layer, wherein the second conductive layer is configured to diffusely reflect external light from one side of the substrate;
   a passivation layer disposed on the second conductive layer;
   a color filter disposed on the passivation layer; and
   an anode layer disposed on the color filter;

wherein the first conductive layer, the dielectric insulating layer, and the second conductive layer are configured to form a capacitor in the capacitor region.

2. The array substrate according to claim 1, wherein the second conductive layer comprises:
   a semi-reflective metal layer disposed on the dielectric insulating layer; and
   a diffuse reflection layer disposed on the semi-reflective metal layer.

3. The array substrate according to claim 2, wherein a material of the semi-reflective metal layer comprises Ag or MgAg alloy.

4. The array substrate according to claim 1, wherein the driving circuit layer further comprises a thin film transistor unit, and a drain electrode of the thin film transistor unit is electrically connected to the anode layer.

5. A method of manufacturing an array substrate, comprising following steps:
   providing a substrate;
   forming a driving circuit layer on the substrate, wherein the driving circuit layer comprises a first conductive layer and a dielectric insulating layer disposed on the first conductive layer;
   forming a second conductive layer on the driving circuit layer, wherein the second conductive layer is configured to diffusely reflect external light from one side of the substrate;
   forming a passivation layer on the second conductive layer;
   forming a color filter on the passivation layer; and
   forming an anode layer on the color filter;
   wherein the first conductive layer, the dielectric insulating layer, and the second conductive layer are configured to form a capacitor in a capacitor region of the array substrate.

6. The method of manufacturing the array substrate according to claim 5, wherein the step of forming the second conductive layer comprises:
   forming a semi-reflective metal layer on the dielectric insulating layer, wherein a material of the semi-reflective metal layer comprises Ag or MgAg alloy; and
   coating an organic material on the semi-reflective metal layer.

7. A display panel comprising the array substrate according to claim 1.

8. The display panel according to claim 5, further comprising:
   a light emitting layer disposed on the anode layer;
   a cathode layer disposed on the light emitting layer; and
   a packaging layer disposed on the cathode layer.

* * * * *